United States Patent [19]
Sonoda

[11] Patent Number: 6,111,304
[45] Date of Patent: Aug. 29, 2000

[54] SEMICONDUCTOR DIFFUSED RESISTOR AND METHOD FOR MANUFACTURING THE SAME

[75] Inventor: Yasuhiro Sonoda, Kumamoto, Japan

[73] Assignee: NEC Corporation, Tokyo, Japan

[21] Appl. No.: 08/918,956

[22] Filed: Aug. 26, 1997

[30] Foreign Application Priority Data

Aug. 29, 1996 [JP] Japan ................................ 8-228922

[51] Int. Cl.⁷ .................................................. H01L 19/00
[52] U.S. Cl. .................. 257/536; 257/374; 257/446; 257/505; 257/506; 257/507; 257/524; 257/336; 257/537; 257/541; 257/543; 257/344; 257/359
[58] Field of Search ................................ 257/374, 446, 257/536, 505–507, 524, 336, 537, 541, 543, 359, 344

[56] References Cited

U.S. PATENT DOCUMENTS

| Re. 32,800 | 12/1988 | Han et al. | 257/336 |
|---|---|---|---|
| 3,729,662 | 4/1973 | Langdon | 317/234 |
| 3,889,358 | 6/1975 | Bierhenke | 257/536 |
| 5,227,327 | 7/1993 | Sasaki | 257/536 |
| 5,691,564 | 11/1997 | Oyamatsu | 257/506 |
| 5,717,238 | 2/1998 | Aronowitz et al. | 257/336 |

FOREIGN PATENT DOCUMENTS

| 405243500 | 9/1993 | Japan | 257/536 |
|---|---|---|---|
| 1-217796 | of 1996 | Japan | |
| 1-263998 | of 1996 | Japan | |
| 2-123597 | of 1996 | Japan | |
| 5-28788 | of 1996 | Japan | |
| 8-129894 | of 1996 | Japan | |
| 8-77783 | of 1996 | Japan | |

*Primary Examiner*—Fetsum Abraham
*Attorney, Agent, or Firm*—Laff, Whitesel & Saret, Ltd.; J. Warren Whitesel

[57] ABSTRACT

According to the present invention, a semiconductor device, and method for producing the same, is provided comprising: a resistance component formed in a component active region enclosed by a component separating-insulating layer on a semiconductor base; one pair of first diffusion layers containing a high concentration of impurities which are provided at both ends of the component active region; silicide layer adhering to a first diffusion layer; second diffusion layer containing a low concentration of impurities which is provided in the component active region between the pair of first diffusion layers; wherein a first diffusion layer and silicide layer comprise the terminal areas of the resistance component, and the second diffusion layer comprises a resistance member area of the resistance component. According to the resistance component of the present invention, the method for manufacturing a semiconductor device according the present invention can be shortened, and a high integration or densification of the semiconductor device can be achieved.

17 Claims, 7 Drawing Sheets

SEMICONDUCTOR DIFFUSED RESISTOR AND METHOD FOR MANUFACTURING THE SAME

BACKGROUND OF THE INVENTION

1. Technical Field of the Invention

The present invention relates to a semiconductor device and method for manufacturing the same. In particular, the present invention relates to a construction for a resistance component and method for manufacturing the same.

2. Background Art

As in the past, the refinement and high densification of semiconductor components are energetically being advanced. Currently, developmental testing is being performed on ultra integrated semiconductor devices such as memory devices, logic devices and the like, which are designed at a dimensional standard of 0.15~0.25 micrometers. Accompanying this high integration of semiconductor devices has been a particular demand for decreasing the diffusion layer width dimensions, as well as reducing the thickness of materials comprising the semiconductor components.

In this manner, conjugation reduction of the diffusion layer results in an increase in the parasitic resistance of the MOS transistor, and a decrease in the driving capabilities of this MOS transistor. Hence, with regard to the refinement of a semiconductor device, a technology for forming a silicide layer of a high melting point metal onto the surface of either the diffusion layer or gate electrode becomes important. In particular, silicide technology or Salicide technology (self-aligned silicide technology) using titanium as the high melting point metal is indispensable to a refined MOS transistor.

On the other hand, in a semiconductor device, in order to construct a logical circuit or input protection circuit, it is essential to form a resistance component by means of a diffusion layer. However, when the surface of the diffusion layer is silicidized (reacted to form a silicide) or Salicidized (reacted under Salicide technology), the resistance of the diffusion layer decreases thereby rendering formation of a resistance component impossible.

Hence, in a semiconductor device wherein a silicide layer is formed onto the surface of a diffusion layer as mentioned above, the silicide layer on top of the diffusion layer forming the resistance component is selectively removed.

In the following, a conventional example relating the aforementioned case will be explained based on FIG. 7. FIG. 7A is a diagram showing a plan view of a resistance component.

FIG. 7B is a diagram showing a cross-sectional view of a resistance component along the line A'–B' of FIG. 7A.

As shown in FIG. 7A, an impurity diffusion Layer 103 is provided which is enclosed by a component separating-insulating layer 102. Here, a silicide layer is not formed onto impurity diffusion layer 103. Instead, silicide layers 104 are formed in the areas at both ends of impurity diffusion layer 103. Furthermore, contact apertures 105 are formed in a predetermined area of silicide layer 104, by means of which silicide layer 104 communicates with electrode 106.

In the following, the cross-sectional structure of this type of resistance component will be explained with reference to FIG. 7B. As shown in FIG. 7B, a component separating-insulating layer 102 is selectively formed in a predetermined region on the surface of silicon base 101. In addition, an impurity diffusion layer 103 is formed in a region on the surface of silicon base 101 wherein component separating-insulating layer 102 is not formed. As shown in FIG. 7B, silicide layers 104 are formed only at the terminal areas at both ends of the aforementioned impurity diffusion layer 103. Furthermore, an interlayer insulating Layer 107 is formed covering the entire surface thereof with contact apertures 105 provided in the areas in which interlayer insulating layer 107 overlies silicide layers 104. Additionally, an electrode 106 is provided which electrically communicates with silicide layer 104 via contact apertures 105.

Here, the electrical resistance of the silicide layer 104 areas is extremely low. As a result, the resistance of the resistance component possessing the aforementioned structure is determined by means of the resistance of the impurity diffusion layer in the area which does not contain a silicide layer on the surface thereof. Furthermore, the impurity diffusion layer area which does not contain a silicide layer on the surface thereof is formed by means a process in which a metallic layer for use in silicide formation is adhered to the entire surface of the impurity diffusion layer, followed by selective removal of the metallic layer from area(s) wherein a silicide layer is not formed.

In the case of this type of conventional technology, formation of an area on the surface of the impurity diffusion layer which does not contain a silicide layer requires a process for selectively removing the metallic layer which is to be used in silicidation (formation of silicide) from area(s) wherein the aforementioned silicide layer is not formed. As a result, it is necessary to add at least one photolithography process and/or dry-etching process. This aspect, however, serves as the main impediment to shortening the manufacturing process for manufacturing the aforementioned semiconductor device.

In addition, in the formation of the impurity diffusion layer according to the aforementioned conventional example, the introduction of impurities into the impurity diffusion layer is conducted at the same time as the formation of the source-drain region of the MOS transistor. As a result, the impurity concentration of the impurity diffusion layer is generally high. Thus, an extended formation of a impurity diffusion layer is required in order to form a resistance component possessing a high resistance (i.e., when a resistance component possessing a high resistance is necessary). This aspect hinders the high integration or high densification of a semiconductor device.

Alternatively, in the case of the aforementioned conventional example, it is possible to reduce the impurity concentration within the impurity diffusion layer when forming the source-drain diffusion region of the MOS transistor by means of an Lightly Doped Drain (LDD) structure. However, this in turn requires that a mask for preventing the introduction of a high concentration of impurities be formed once into the impurity diffusion layer. As a result, the aforementioned case requires the addition of another round of the photolithography step.

SUMMARY OF THE INVENTION

In consideration of the aforementioned problems raised by the conventional art, it is an object of the present invention to provide a semiconductor device, and method for manufacturing the same, possessing a resistance component wherein a high integration can be achieved while shortening the manufacturing process at the same time.

In order to achieve the aforementioned object, the present invention provides a semiconductor device comprising:

resistance component formed in a component active region enclosed by a component separating-insulating layer on a semiconductor base;

one pair of first diffusion layers containing a high concentration of impurities which are provided at both ends of said component active region;

silicide layer adhering to said first diffusion layer;

second diffusion layer containing a low concentration of impurities which is provided in said component active region between said pair of first diffusion layers;

wherein said first diffusion layer and silicide layer form a terminal area of said resistance component, and said second diffusion layer comprises a resistance member area of said resistance component.

In addition, a semiconductor device is provided further comprising in said component active region between said first diffusion layers, a conducting layer formed in said component active region via a first insulating layer which is separated by a predetermined clearance; wherein said second diffusion layer is formed in self-aligning manner with said conducting layer separated by a predetermined clearance; a second insulating layer is formed only at the side wall portion of said conducting layer; and a region is formed above said second diffusion layer which is separated by a predetermined clearance and filled by means of said second insulating layer.

Alternatively, a semiconductor device is provided wherein a conducting layer covers a portion of said component active region between said first diffusion layers via a first insulating layer; a channel region comprises a portion of said component active region; a resistance member region is formed by means of said second diffusion layer and said channel region; a second insulating layer is formed only at the side wall portion of said conducting layer; and said second diffusion layer is covered by means of said second insulating layer.

In addition, according to a semiconductor device of the present invention, a source-drain region of an insulating gate field-effect transistor comprising said semiconductor device possesses an LDD structure; and said second diffusion layer is formed by means of the same process as an LDD layer.

Alternatively, said first insulating layer and said conducting layer are respectively formed by means of a gate insulating layer of an insulating gate field-effect transistor and gate electrode.

Alternatively, according to a semiconductor device of the present invention, said resistance component forms a protection circuit of said semiconductor device; and said conducting layer enters a floating state to which no electric potential is imparted.

Alternatively, said resistance component forms a logical circuit of said semiconductor device; and a fixed electric potential is imparted to said conducting layer.

In addition, a method for manufacturing a semiconductor device, described in the aforementioned, is provided comprising the steps of:

forming a patterned conducting layer on a portion of said component active region between said first diffusion layers via a first insulating layer;

forming a second diffusion layer comprising an LDD layer formed in a self-aligning manner with said conducting layer pattern;

forming a second insulating layer comprising a side wall insulating layer formed in a side wall portion of said conducting layer;

forming a first diffusion layer comprising a diffusion layer containing a high impurity concentration formed in a self-aligning manner with said conducting layer and said second diffusion layer; and forming a silicide layer by means of performing silicidation of said first diffusion layer.

According to the present invention, a conducting layer, second diffusion layer which self-aligns with a gate electrode, or an LDD layer is formed, wherein the second diffusion layer, or LDD layer are completely covered by means of a second insulating layer comprising a side wall insulating layer formed in a side wall portion of the conducting layer or gate electrode. As a result, due to the formation of a first diffusion layer, the aforementioned LDD layer (i.e., second diffusion layer) is automatically protected during the introduction of a high concentration of impurities. In addition, this LDD layer is protected even during the formation of the silicide Layer. In this manner, the resistance region of the resistance component comprises a diffusion layer containing only a low concentration of impurities. Therefore, the method for manufacturing the resistance component according the present invention can be shortened. Furthermore, the dimensions of the resistance component can be decreased, and a high integration or densification of the semiconductor device can be achieved.

DETAILED DESCRIPTION OF PREFERRED EMBODIMENTS

Figure 1:
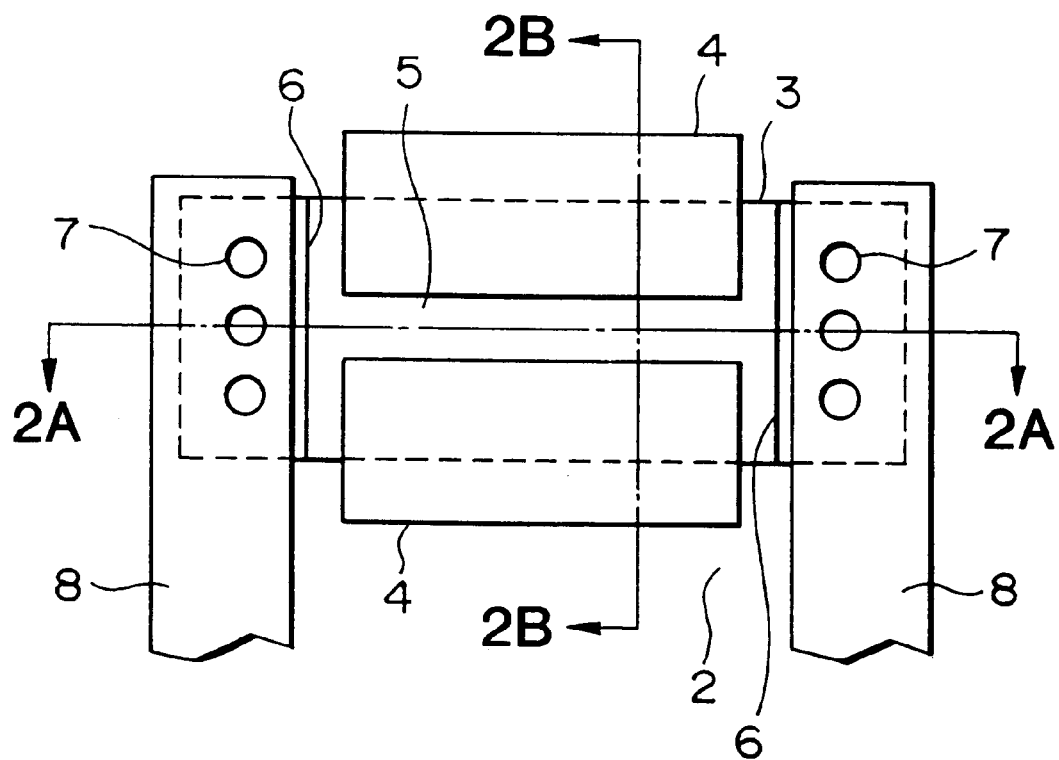
FIG. 1 is a diagram showing a plan view of a resistance component for use in explaining a first preferred embodiment of the present invention.
Figure 2A:
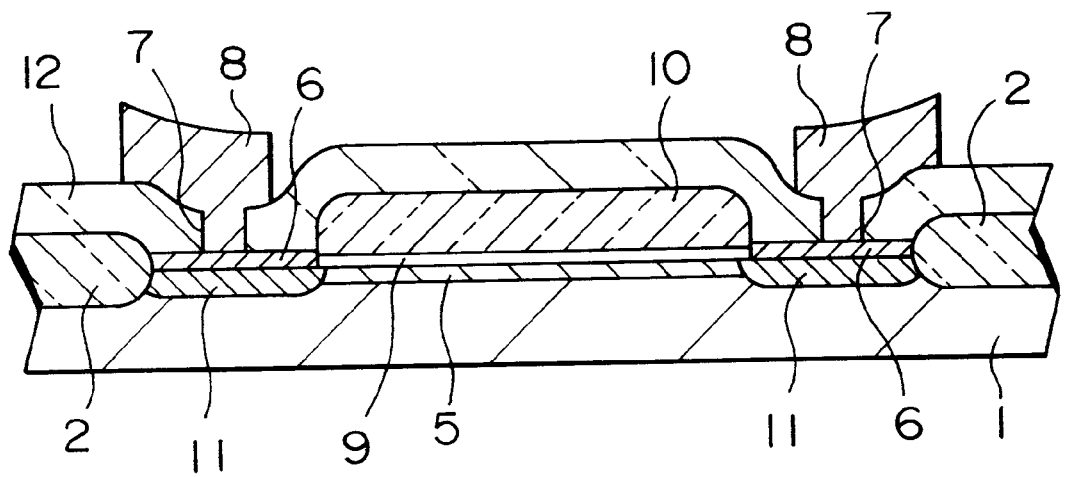
FIGS. 2A to 2B are diagrams showing cross-sectional views of a resistance component for use in explaining a first preferred embodiment of the present invention.
Figure 2B:
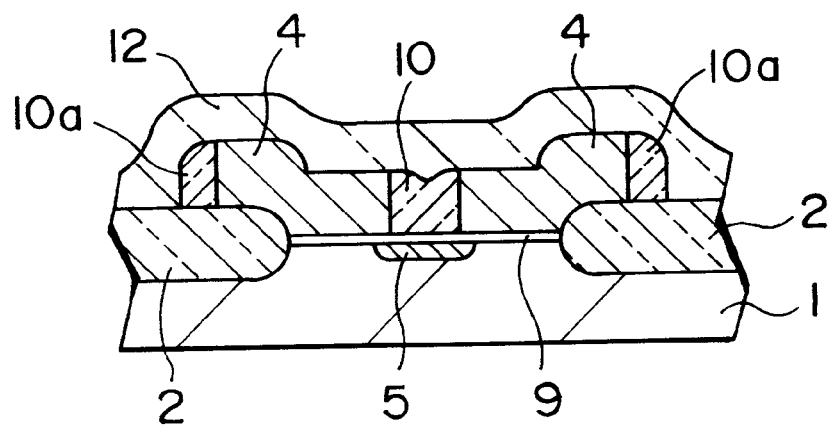

In the following, a first preferred embodiment of the present invention will be explained with reference to FIG. 1 and FIG. 2. FIG. 1 is a diagram showing a plan view of a resistance component according to the present invention. In addition, FIG. 2A is a cross-sectional view of a resistance component according to the present invention cut along the line A–B in FIG. 1. FIG. 2B is a cross-sectional view of a resistance component according to the present invention cut along the line C–D in FIG. 1.

As shown in FIG. 1, a pair of gate electrodes 4 are provided facing each other in a component active region 3 which is enclosed by a component separating-insulating layer 2. In addition, a resistance diffusion layer is formed between this pair of gate electrodes 4. Furthermore, silicide layers 6 are formed at both ends of the component active region 3. Contact apertures 7 are formed in a predetermined region of these silicide layers 6 by means of which silicide layers 6 communicate with electrode 8.

In the following, a cross-sectional structure of the resistance component of the present invention will be explained. As shown in FIG. 2A, component separating-insulating layer 2 is selectively formed in a predetermined region on the surface of a silicon base 1. Gate insulating layer 9 and side wall insulating layer 10 are formed and stacked in the region on the surface of silicon base 1 which is not occupied by component separating-insulating layer 2 (i.e., the central part thereof).

Resistance diffusion layer 5 is formed in a self-aligning manner with the aforementioned side wall insulating layer 10. Furthermore, as shown in FIG. 2A, impurity diffusion layers 11 are formed only at the ends of the component active region; silicide layers 6 are formed on and restricted to the top portions of the aforementioned impurity diffusion layers 11. Here, the impurity diffusion layers 11 and silicide layers 6 are formed in a self-aligning manner with side wall insulating layers 10.

In addition, an interlayer insulating layer 12 is formed covering the entire structure through which contact apertures 7 are provided which allow communication with the areas above silicide layers 6. Furthermore, an electrode 8 is provided which electrically communicates with silicide layers 6 via contact apertures 7.

In the following, another cross-sectional structure of the resistance component of the present invention will be explained using FIG. 2B. As shown in FIG. 2B, a component separating-insulating layer 2 is selectively formed on the surface of a silicon base 1. In a component active region enclosed by component separating-insulating layer 2, a pair of gate electrodes 4 are formed facing each other via gate insulating layer 9. In addition, side wall insulating layer 10 is formed in a region between the aforementioned pair of gate electrodes 4. A resistance diffusion layer 5 is -formed onto the surface of silicon base 1 only on the bottom of this side wall insulating layer 10. Furthermore, side wall insulating layer 10 is formed to the terminal end pattern of gate electrode 4, while side wall insulating layer 10a is formed to the peripheral pattern of gate electrode 4.

In the following, a method for manufacturing a resistance component according to the first preferred embodiment will be explained using FIGS. 3~5. Here, FIGS. 3A~D are cross-sectional diagrams showing a manufacturing step sequence for the resistance component structure explained in FIG. 2B. In addition, FIGS. 4~5 are a cross-sectional diagrams showing a manufacturing step sequence for the resistance component source structure explained in FIG. 2A.

Figure 3A:
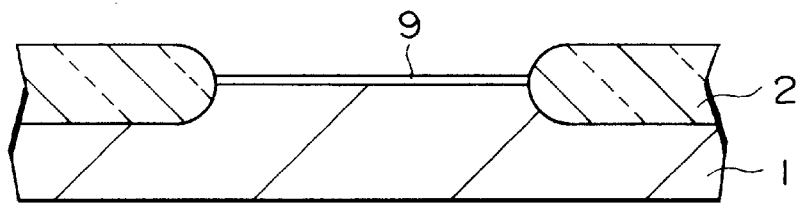
FIGS. 3A to 3D are diagrams showing cross-sectional views of a manufacturing step sequence for use in explaining a method for manufacturing the aforementioned resistance component.

As shown in FIG. 3A, the semiconductor is a. P-type semiconductor wherein a component separating-insulating layer 2 is selectively formed onto the surface of silicon ba:Be 1 having an impurity concentration of approximately $10^{16}$ atoms/cm$^3$. This component separating-insulating layer 2 is formed by means of a conventional LOCOS (Local Oxidation of Silicon) method. In addition, a gate insulating layer 9 is formed onto t:he surface of silicon base 1 in the region to form the component active region. With regard to the layer thickness (formed by means of thermal oxidation), gate insulating layer 9 comprises a silicide layer of approximately 10 nm.

Figure 3B:
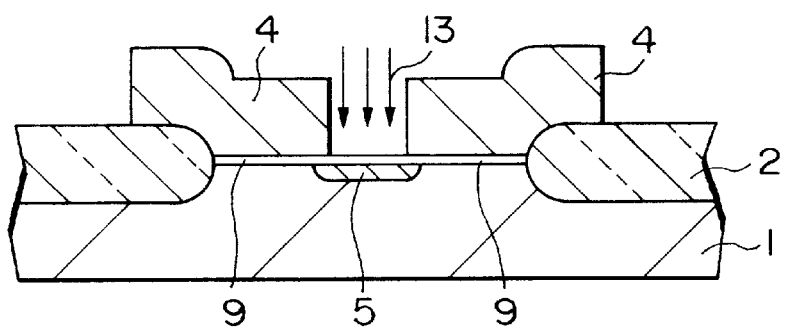

In the following, as shown in FIG. 3B, the pair of gate electrodes 4 which face each other are formed in a manner such that they partially cover a portion of gate insulating membrane 9 and component separating-insulating layer 2. This gate electrode 4 comprises either a polycrystalline silicon layer containing phosphorous impurities or a silicide layer such as a tungsten silicide layer or the like.

Ion implantation is performed with arsenic ion L3. Here, the ion implantation energy is 50 keV, and the dose amount is set to a range of $10^{12}$ atoms/cm$^2$~$10^{14}$ atoms/cm$^2$. A heating process (thermal treatment) is then conducted in order to activate the impurities. In this manner, resistance diffusion layer 5 is formed in a self-aligning manner with gate electrode 4. Furthermore, this resistance diffusion layer 5 is formed by means of a process identical to that used in the formation of the LDD layer comprising the N-channel MOS transistor possessing an LDD structure.

Figure 3C:
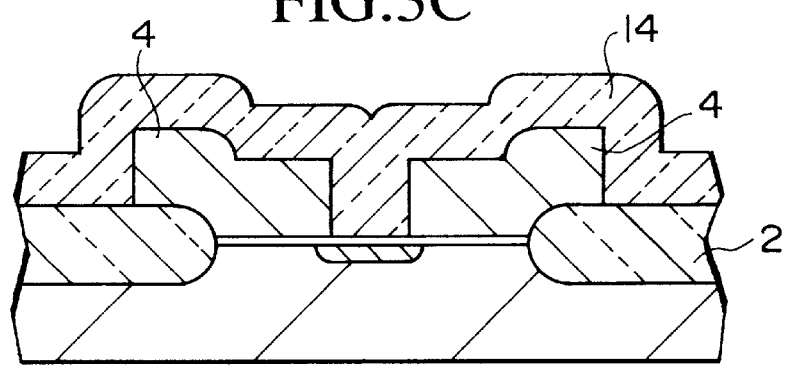

Subsequently, as shown in FIG. 3C, insulating layer 14 is formed in a manner so as to cover the entire structure, including gate electrode 4 and component separating-insulating layer 2. This insulating layer 14 is a layered silicide layer formed by means of a chemical vapor deposition (CVD) process.

Figure 3D:
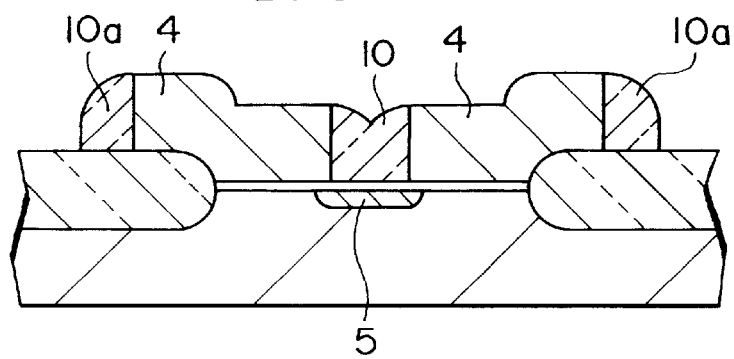

This insulating layer 4 then undergoes anisotropic etching by means of a reactive ionic etching process over the entire surface thereof. In other words, etchback of insulating layer 4 is performed. In this manner, as shown in FIG. 3D, side wall insulating layers 10 and 10a are formed in the side walls of gate electrode 4. Furthermore, side wall insulating layer 10 formed by means of etchback processing of insulating layer 4 is formed in such a manner as to completely fill the space between gate electrodes 4 on resistance diffusion layer 5. As a result, it is necessary for the thickness of insulating layer 4 to be set to a value larger than the aforementioned space between gate electrodes 4.

After completing the aforementioned, an impurity diffusion layer, silicide layer, interlayer insulating layer or the like is formed (not shown in the figure) to complete the resistance component structure described in FIG. 2B. Furthermore, the formation of the impurity diffusion layer, silicide layer and the like will be explained by mean of FIGS. 4~5.

Figure 4A:
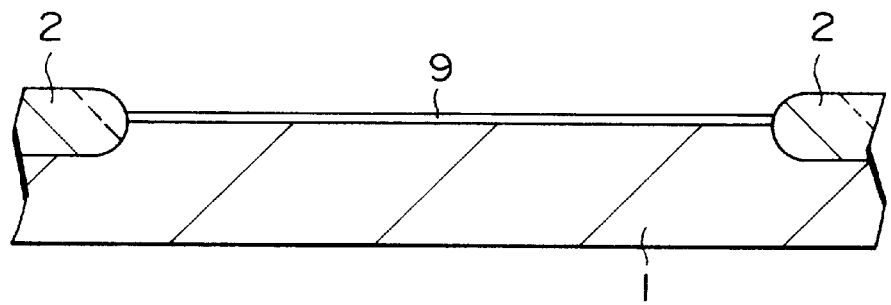
FIGS. 4A to 4D are diagrams showing cross-sectional views of a manufacturing step sequence for use in explaining a method for manufacturing the aforementioned resistance component.

In the following, a method for manufacturing a resistance component according to the present invention will be explained using another cross-sectional structure. As shown in FIG. 4A, a component separating-insulating layer 2 is selectively formed onto the surface of silicon base 1 as explained in FIG. 3A. A gate insulating layer 9 is then formed onto the surface of silicon base 1 to comprise the component active region.

Figure 4B:
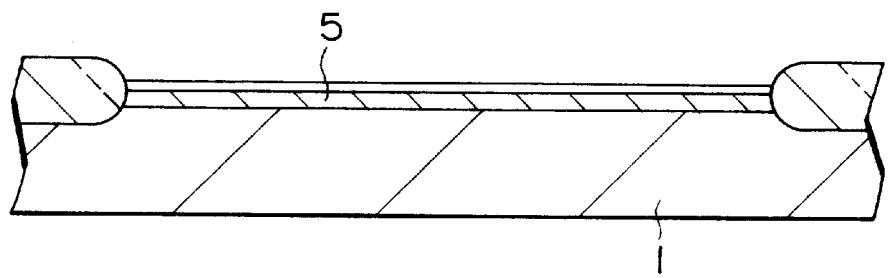

As shown in FIG. 4B, a resistance diffusion layer 5 is subsequently formed onto the surface of silicon base 1 to comprise the component active region. This resistance diffusion layer 5 is formed as described in FIG. 3B. In other words, resistance diffusion layer 5 is formed by means of a process identical to that used in the formation of the LDD layer of MOS transistor comprising an LDD structure.

Figure 4C:
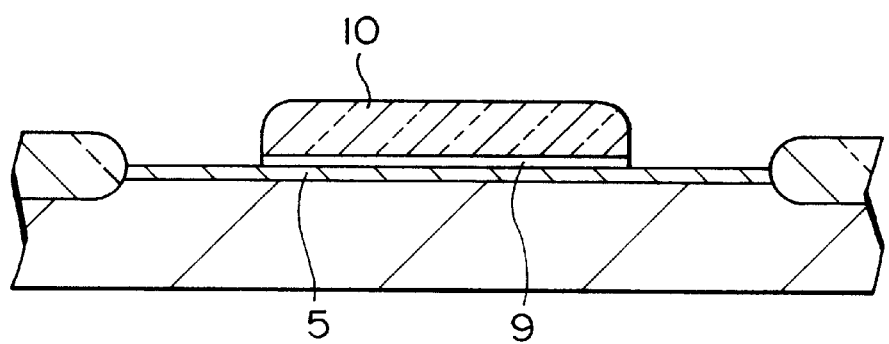

Subsequently, as shown in FIG. 4C, side wall insulating layer 10 is formed in a predetermined region of resistance diffusion layer 5. This sidewall insulating layer 10 is formed in the same manner as described in FIG. 3C and FIG. 3D.

Figure 4D:
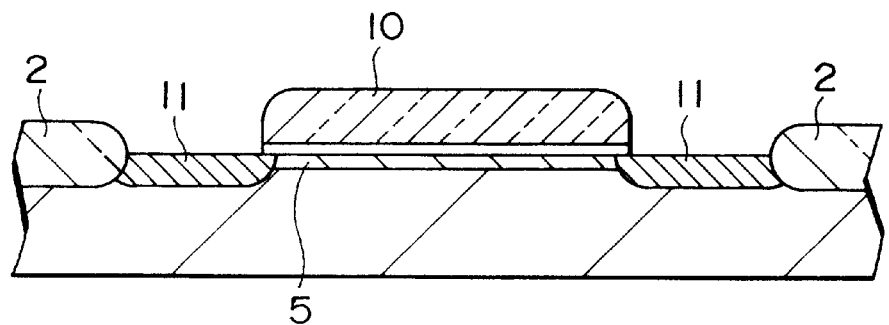

As shown in FIG. 4D, impurity diffusion layer 11 is formed in a self-aligning manner with side wall insulating layer 10 so as to electrically communicate with resistance diffusion layer 5. This impurity diffusion layer 11 is formed by means of the same process used to form the source-drain region containing a high concentration of impurities in the MOS transistor comprising an LDD structure. In other words, impurity diffusion layer 11 is formed by means of performing arsenic ion implantation using component separating-insulating layer 2 and side wall insulating layer 10 as a mask, followed by a thermal treatment to activate the impurities. Here, the arsenic ion implantation energy is 60 keV, and the dose amount is set to approximately $5\times10^{15}$ ions/cm$^2$.

Figure 5A:
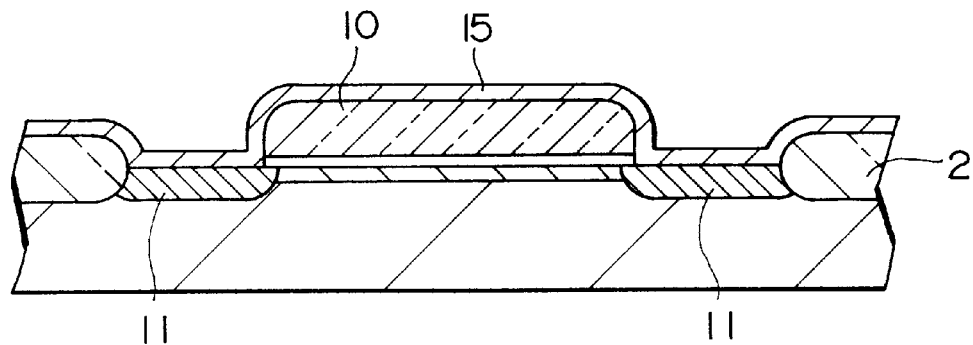
FIGS. 5A to 5C are diagrams showing cross-sectional views of a manufacturing step sequence for use in explaining a method for manufacturing the aforementioned resistance component.

As shown in FIG. 5A, a titanium layer 15 possessing a thickness of approximately 50 nm is then formed over the surface of the entire structure by means of a metal spattering process or the like. Thermal treatment under N$_2$ (nitrogen) environment at atmospheric pressure is then performed for 30~60 seconds. Normally, the thermal treatment equipment used is a lamp annealing apparatus set to a processing temperature of 600~650° C. In this manner, the silicidation of titanium is carried out.

Figure 5B:
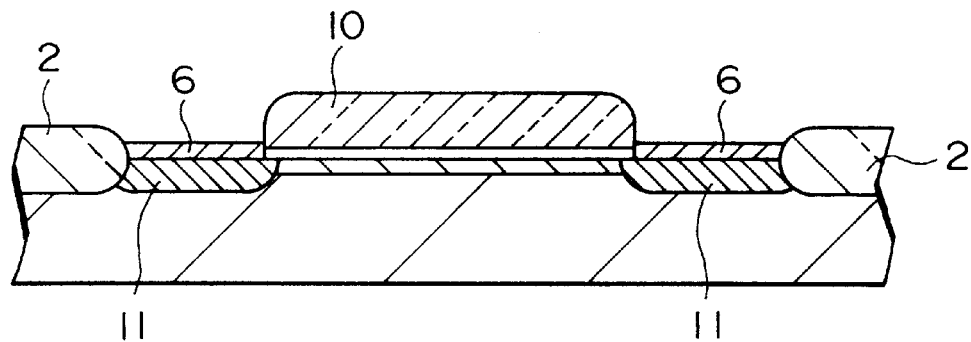

Subsequently, as shown in FIG. 5B, silicide layers 6 are formed onto the surface of impurity diffusion layer 11. An unreacted titanium layer then forms as a residue with the titanium nitride layer on side wall insulating layer 10 and component separating-insulating layer 2. At this point, the aforementioned unreacted titanium layer and titanium nitride layer are then removed using a chemical reagent obtained by mixing an ammonia solution, pure water and hydrogen peroxide. Here, the titanium layer elutes out but does not dissolve in the chemical reagent. However, the titanium nitride layer is removed by a "lift off" phenomenon induced by the elution of the titanium layer. Furthermore, in this process there is absolutely no etching of silicide layer 6.

By means of the aforementioned processes, silicide layers 6 are respectively formed in a self-aligning manner only on impurity diffusion layer 11. Furthermore, when gate electrode 4 comprises a polycrystalline silicon layer, a titanium silicide layer is formed onto the surface of gate electrode 4 as well.

Figure 5C:
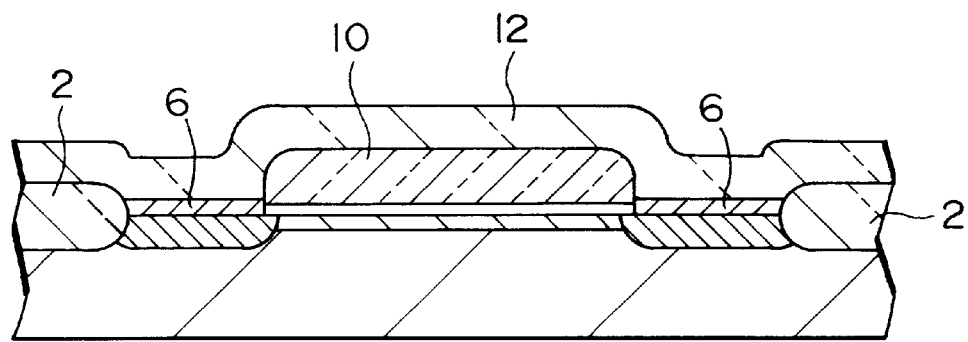

Subsequently, as shown in FIG. 5C, interlayer insulating layer 12 is formed in a manner so as to cover component separating-insulating layer 2, silicide layer 6 and side wall insulating layer 10. This interlayer insulating layer 12 is a silicide layer which is layered by means of a CVD process.

Contact apertures 7 are then formed in a predetermined region of interlayer insulating layer 12, and an electrode is provided to complete the resistance component structure shown in FIG. 2A.

As described in the aforementioned, according to the present invention, an LDD layer can be used as a resistance diffusion layer by simply devising a pattern for a gate electrode according to the same method for forming an LDD region of MOS transistor for constructing a semiconductor device. As a result, the manufacturing process can be shortened, and high integration of the semiconductor device can be easily accomplished.

Furthermore, in the resistance component manufactured by means of the aforementioned manufacturing process, gate electrode 4 comprising the resistance component is fixed to a ground electric potential. This is to prevent the inversion of the silicon base surface underneath the gate electrode 4 shown in FIG. 3D. This measure is necessary since the connecting resistance with the resistance diffusion layer 5 is altered if this region inverts to an N-type mode.

In addition, it is also possible to form the resistance diffusion layer of the resistance component using a P-type semiconducting layer. In this case, the aforementioned formation is conducted using the same process for forming a source-drain region of a P-channel MOS transistor. Furthermore, in the above case, a power source voltage is applied to gate electrode 4.

In addition, in the resistance component of the present invention, in the case when a silicide layer 6 is formed on the impurity diffusion layer 11, destruction of the insulation provided by gate insulating layer 9 commonly occurs when an excessive voltage is applied to the terminal of the resistance component (i.e., electrode 8). With regard to this potential problem, it is best to allow the gate electrode to enter a floating state without applying any voltage to gate electrode 4. This type of gate electrode construction is extremely effective in the case when the resistance component of the present invention comprises a protection circuit for a semiconductor device.

Figure 6A:
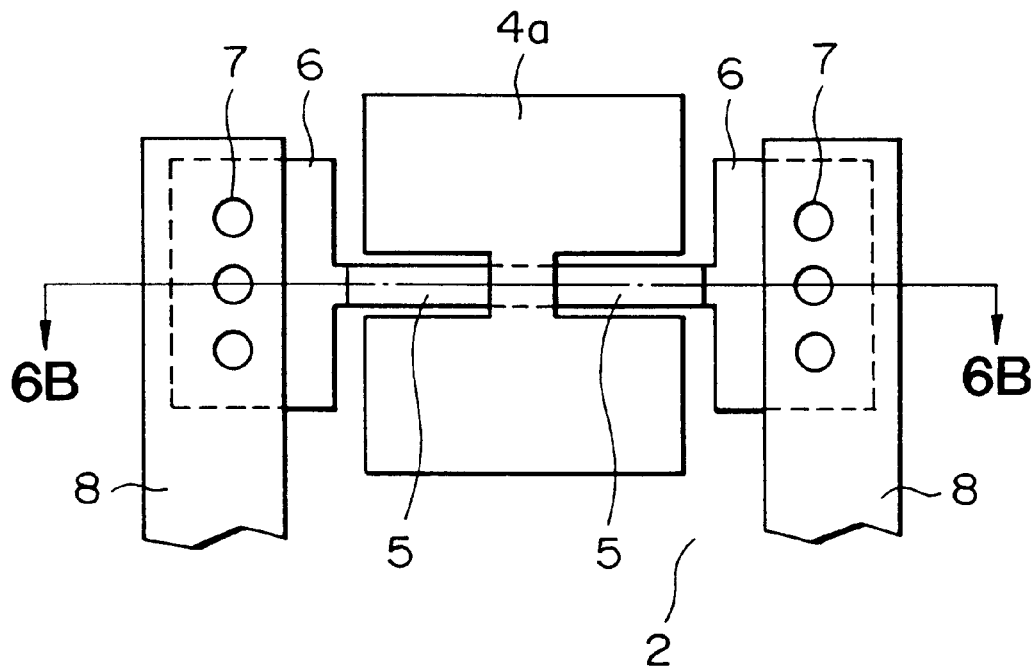
FIGS. 6A and 6B respectively show a plan view and a cross-sectional view of a resistance component for use in explaining a second preferred embodiment of the present invention.
Figure 6B:
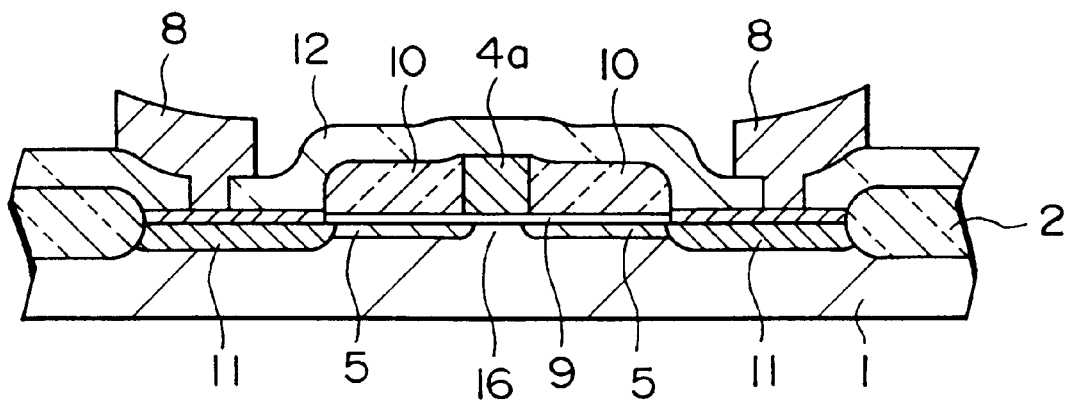
Figure 7A:
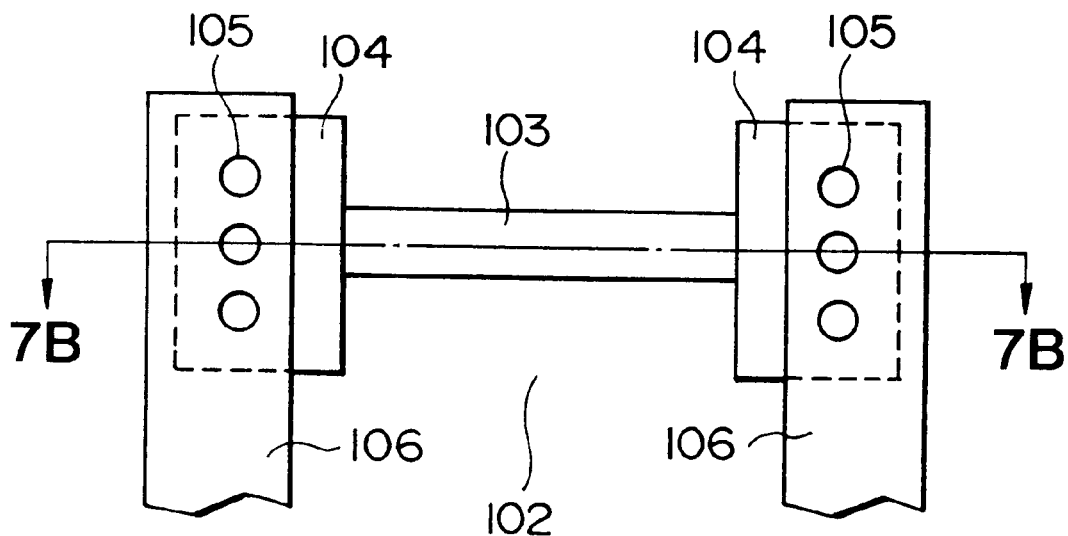
FIG. 7A is a diagram showing a plan view of a resistance component according to a conventional example.
Figure 7B:
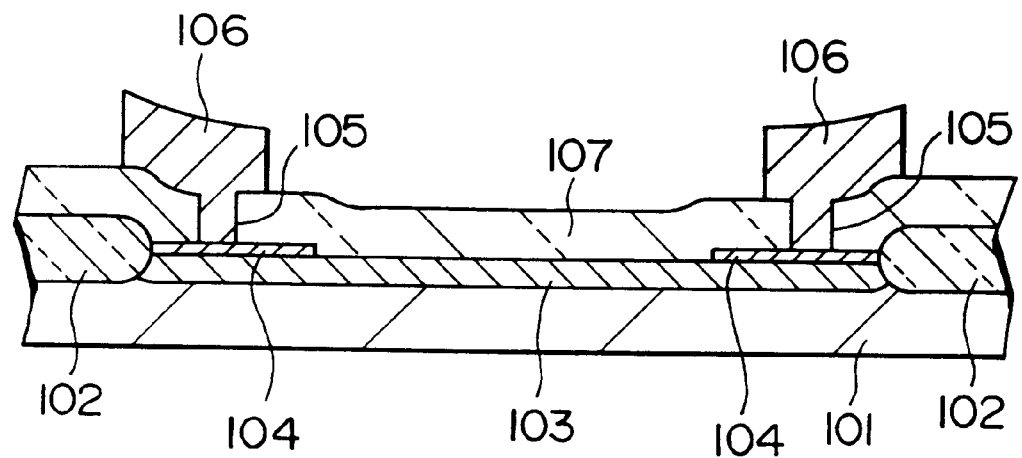
FIG. 7B is a diagram showing a cross-sectional view of a resistance component cut along the line A'–B' of FIG. 7A.

In the following, a second preferred embodiment of the present invention will be explained based on FIG. 6. FIG. 6A is a diagram showing a plan view of the resistance component according to the present invention. In addition, FIG. 6B is a diagram showing a cross-sectional view of a resistance component cut along the line E–F of FIG. 6A. With regard to the explanations of these figures, items described above in the first preferred embodiment will be denoted by the same numerals.

As shown in FIG. 6A, gate electrode 4$a$ is Formed in a manner such that a central portion thereof covers a part of the component active region enclosed by component separating-insulating layer 2. In this manner, resistance diffusion layer 5 is divided into two regions by means of gate electrode 4$a$ covering a part of this component active region. In addition, a silicide layer 6 is formed at each end of the component active region. Furthermore, contact apertures 7 are formed in a predetermined region of these silicide layers 6. Each of the silicide layers 6 communicates to an electrode 8 via these contact apertures 7.

In the following, the cross-sectional structure of this type of resistance component will be explained. As shown in FIG. 6B, a component separating-insulating layer 2 is selectively formed in a predetermined region on the surface of silicon base 1. Gate electrode 4$a$ is formed onto a region on the surface of silicon base 1 which is not occupied by component separating-insulating layer 2 (i.e., in the central portion of the component active region of silicon base 1) with a gate insulating layer 9 lying therein between. On each side thereof, a insulating layer 9 and side wall insulating layer 10 are formed in a layered manner.

In this case as well, two resistance diffusion layers 5 are formed in a self-aligning manner with side wall insulating layers 10 as shown in FIG. 6. Between these two resistance diffusion layers 5, a channel region 16 is formed comprising a channel of a MOS transistor possessing gate electrode 4$a$. As described in FIG. 2A, impurity diffusion layers 11 are formed only at the ends of the component active region; silicide layers 6 are formed on and restricted to the top portions of the aforementioned impurity diffusion layers 11. The impurity diffusion layers 11 and silicide layers 6 are respectively formed in a self-aligning manner with side wall insulating layer 10. Furthermore, an interlayer insulating layer 12 is formed covering the entire structure wherein contact apertures 7 are formed in the areas overlying silicide layers 6. In addition, an electrode 8 is provided which electrically communicates with silicide layers 6 via contact apertures 7.

In the case of the second preferred embodiment, the region forming the resistance member comprises resistance diffusion layer 5 and channel region 16. The channel of the MOS transistor has an extremely high resistance. As a result, the resistance of the resistance component in this case can also be set extremely high.

Furthermore, according to this second preferred embodiment, a voltage capable of inverting channel region 16 is applied to gate electrode 4a.

According to the aforementioned second preferred embodiment, an example was provided in which the resistance component was formed by means of the same process used to form the source-drain region in a MOS transistor comprising an LDD structure. In the above case, the resistance diffusion layer comprises an LDD layer wherein side wall insulating layer 10 is used as a mask for preventing the introduction of a high concentration of impurities into the aforementioned region.

Masks used for preventing the introduction of a high concentration of impurities are not limited to just the aforementioned. In a semiconductor device loaded onto a logical circuit a capacitor becomes necessary. With regard to this capacitor, there are cases in which this capacitor comprises a gate electrode, onto which a dielectric layer is provided wherein an opposing electrode is provided onto the top portion thereof. In this case, it is also possible to use the opposing electrode as the aforementioned mask.

According to the present invention, a resistance component is formed by means of the same process used to form the source-drain region in a MOS transistor comprising an LDD structure. In this case, a pattern of a semiconductor component, e.g., gate electrode pattern, is used in the same form as a mask in order to prevent the introduction of a high concentration of impurities into the resistance diffusion layer.

In addition, the silicide layers present over the source-drain region are selectively formed in such a manner as to avoid the area above the resistance diffusion layer of the resistance component. Similarly, in this case, the pattern comprising a semiconductor component as described above is used in its original form as a mask. As a result, the method for manufacturing a semiconductor device according to the present invention can be shortened when compared to the conventional art. Furthermore, according to the method of the present invention, the concentration of impurities within the resistance diffusion layer can be easily controlled, while decreasing dimensions of the resistance component. Consequently, a high integration or densification of the semiconductor device can be achieved.

What is claimed is:

1. A semiconductor device:
   a resistant component formed in a component active region enclosed by a component separation insulating layer on a semiconductor base;
   one pair of first diffusion layers containing a high concentration of impurities which are provided at both ends of said component active region;
   suicide layers formed on said pair of first diffusion layers;
   two conductive films not attached to said silicide layers which are separated from each other by a predetermined space on said component active region through a first insulating layer;
   a second diffusion layer containing a low concentration of impurities which is provided on said component active region between said pair of first diffusion layers; and
   a second insulating layer formed on said second diffusion layer so as to fill a space between said two conductive layers;
   wherein, said first diffusion layer and said silicide layer form a terminal area and said second diffusion layer constitutes a resistor region of a resistor component.

2. A semiconductor device according to claim 1, wherein a source-drain region of an insulating gate field-effect transistor comprising said semiconductor device possesses an LDD structure; and said second diffusion layer is formed by means of the same process as an LDD layer.

3. A semiconductor device according to claim 2, wherein said first insulating layer and said conducting layer are respectively formed by means of a gate insulating layer of an insulating gate field-effect transistor and gate electrode.

4. A semiconductor device according to claim 1, wherein said resistance component forms a protection circuit of said semiconductor device; and said conducting layers form a floating state to which no electric potential is applied.

5. A method for manufacturing a semiconductor device, as recited in claim 1, comprising the steps of:
   forming a patterned conducting layer on a portion of said component active region between said first diffusion layers via a first insulating layer;
   forming a second diffusion layer comprising an LDD layer formed in a self-aligning manner with said conducting layer pattern;
   forming a second insulating layer comprising a side wall insulating layer formed in a side wall portion of said conducting layer;
   forming a first diffusion layer comprising a diffusion layer containing a high impurity concentration formed in a self-aligning manner with said conducting layer and said second diffusion layer; and
   forming a silicide layer by means of performing silicidation of said first diffusion layer.

6. A method for manufacturing a semiconductor device according to claim 5, wherein the patterned conductive layer is formed on an p-type substrate containing impurities at the concentration of $10^{16}$ atoms/cm$^3$.

7. A method for manufacturing a semiconductor device according to claim 6, wherein the resistance diffusion layer is formed by the steps of:
   selectively forming a component separating-insulating layer on the substrate;
   forming the gate insulating layer on an active component layer;
   forming a pair of gate electrodes covering said gate insulating layer and a portion of component separating insulating layer, the gate electrode being made of polysilicon layer doped with P impurities;
   forming a resistance diffusion layer by ion implantation of As ions; and
   activating the implanted impurity ions.

8. A method for manufacturing a semiconductor device according to claim 7, wherein said resistance component is formed by the steps of:
   forming an insulating layer covering said gate electrodes and component separating-insulating layer;
   performing anisotropic etching of the insulating layer to form the side wall insulating layers;
   forming a impuruty diffusion layer, a silicide layer, and interlayer insulating layer to complete the resistance component structure.

9. A semiconductor device according to claim 1, further comprising in said active component region between said first diffusion layers, a pair of conducting layers formed in said component active region through a first insulating layer between said pair of first diffusion layers; wherein, said second diffusion layer is formed in a self-aligning manner with said pair of conducting layers separated by a predetermined clearance; a second insulating layer is formed only at a side wall portion of said conducting layers; and a region is formed above said second diffusion layer which is separated by a predetermined clearance and filled by means of said second insulating layer.

10. A semiconductor device according to claim 1, wherein said pair of conducting layers covers a portion of said component active region between said first diffusion layers through a first insulating layer; a channel region comprises a portion of said component active region; a resistant member region is formed by means of said second diffusion layer and said channel region; a second insulating layer is formed only at the side wall portion of said conducting layer; and said second diffusion layer is covered by means of said second insulating layer.

11. A semiconductor device according to claim 10, wherein said resistance component forms a logical circuit of said semiconductor device; and a fixed electric potential is imparted to said conducting layer.

12. A semiconductor device comprising
a component active region enclosed by a component separation insulating layer on a semiconductor substrate;
one pair of first diffusion layers containing a high concentration of impurities which are formed at both ends of said component active region, each of said first diffusion layers having a first width in a vertical direction;
silicide layers formed on said pair of first diffusion layers;
two conductive films not attached to said silicide layers which are separated from each other by a predetermined space of said component active region through a first insulating layer;
a second diffusion layer containing a low concentration of impurities formed on said component active region between said two conductive layers, one end of which is connected to one of said one pair of first diffusion layers and the other end of which is connected to another one of said one pair of first diffusion layers, said space between said two conductive layers being narrower than said first width in said vertical direction so that said second diffusion layer has a second width narrower than said first width in said vertical direction to define said second width of said second diffusion with said two conductive films; and
a second insulating layer formed on said diffusion layer so as to fill the space between said two conductive layers, said second insulating layer having a third width which is substantially identical with said second width of the second diffusion layer in said horizontal direction; wherein said first diffusion layer and said silicide layer constitute a terminal region and said second diffusion layer constitutes a resistor region of a resistor component.

13. A semiconductor device according to claim 12, wherein said second diffusion layer corresponds to an LDD layer of an insulating gate field-effect transistor.

14. A semiconductor device according to claim 13, wherein said first insulating film and said conductive films correspond to a gate insulating film and a gate electrodes, respectively.

15. A semiconductor device according to claim 14, wherein said resistor component constitutes a protective circuit and said conductive films are maintained in the floating state.

16. A semiconductor device according to claim 14, wherein said resistor component constitutes a logic circuit, and a fixed voltage is applied to said conductive films.

17. A semiconductor device according to claim 14, wherein said semiconductor device comprises:
a conductive layer formed on said component active layer between said conductive films through said first insulating layer, and connected together with said conductive films; and
a channel layer formed under said conductive layer in said component active layer.

* * * * *